US007555394B2

(12) United States Patent
Caffrey et al.

(10) Patent No.: US 7,555,394 B2
(45) Date of Patent: Jun. 30, 2009

(54) MEASURING CIRCUIT AND A METHOD FOR DETERMINING A CHARACTERISTIC OF THE IMPEDANCE OF A COMPLEX IMPEDANCE ELEMENT FOR FACILITATING CHARACTERIZATION OF THE IMPEDANCE THEREOF

(75) Inventors: James F. Caffrey, Limerick (IE); Colm F. Slattery, Tipperary (IE); Albert C. O'Grady, Mungret (IE); Colin Gerard Lyden, County Cork (IE); Donal P. Geraghty, Monaleen (IE); Sean Smith, County Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/492,606

(22) Filed: Jul. 24, 2006

(65) Prior Publication Data

US 2006/0276982 A1 Dec. 7, 2006

Related U.S. Application Data

(63) Continuation of application No. 10/664,349, filed on Sep. 17, 2003, now abandoned.

(51) Int. Cl.
*G01R 25/00* (2006.01)
*G01R 27/28* (2006.01)

(52) U.S. Cl. .............................. 702/65; 702/66; 702/67; 702/118; 324/637

(58) Field of Classification Search ............. 702/57–59, 702/64–66, 75–77, 117; 324/533–534, 602, 324/609, 633, 637, 642

See application file for complete search history.

(56) References Cited

U.S. PATENT DOCUMENTS 4,526,480 A 7/1985 Ward (Continued)

FOREIGN PATENT DOCUMENTS

CN 1325551 A 9/1999

(Continued)

OTHER PUBLICATIONS

Basu, A. et al., "'Smart sensing' of oil degradation and oil level measurements in gasoline engines", SAE Technical Paper Series, 2001-01-1366, SAE 2000 World Congress, Detroit, MI, Mar. 6-9, 2000.

(Continued)

*Primary Examiner*—Eliseo Ramos Feliciano
*Assistant Examiner*—Phuong Huynh
(74) *Attorney, Agent, or Firm*—Wolf, Greenfield & Sacks, P.C.

(57) ABSTRACT

A single chip integrated circuit measuring circuit (1) for determining a characteristic of the impedance of an external complex impedance circuit (2) for facilitating characterization of the impedance of the complex impedance circuit (2) comprises a signal generating circuit (7) for generating a variable frequency stimulus signal for applying to the complex impedance circuit (2). A first receiving circuit (10) receives a response signal from the complex impedance circuit (2) in response to the stimulus signal and conditions the response signal. A first analog-to-digital converter (68) converts the conditioned response signal to a first digital output signal, which is read from the first analog-to-digital converter (68) through a first digital output port (14). The response signal from the complex impedance circuit (2) is a current signal, and a current to voltage converter circuit (64) converts the response signal to a voltage signal. A first RMS to DC level converting circuit (70) converts the AC voltage of the response signal to a DC voltage level, and a fourth multiplexer (67) selectively applies the voltage response signal or the DC voltage level signal to the first analog-to-digital converter (68), depending on whether it is desired that the first digital output signal should be indicative of the phase shift or amplitude change in the response signal relative to the stimulus signal. A second receiving circuit (20) receives the stimulus signal, and similarly converts the stimulus signal to a second digital output signal for facilitating comparison of the response signal with the stimulus signal.

58 Claims, 2 Drawing Sheets

U.S. PATENT DOCUMENTS

| | | | |
|---|---|---|---|
| 4,831,324 A | 5/1989 | Asakura et al. | |
| 4,832,022 A * | 5/1989 | Tjulkov et al. | 606/22 |
| 5,042,460 A * | 8/1991 | Sakurai et al. | 606/128 |
| 5,365,179 A | 11/1994 | Rogers | |
| 5,633,801 A | 5/1997 | Bottman | |
| 5,772,597 A * | 6/1998 | Goldberger et al. | 600/473 |
| 5,805,871 A * | 9/1998 | Baxter | 713/500 |
| 5,832,412 A * | 11/1998 | Guez | 702/75 |
| 6,161,420 A * | 12/2000 | Dilger et al. | 73/24.01 |
| 6,172,483 B1 | 1/2001 | Champlin | |
| 6,295,272 B1 * | 9/2001 | Feldman et al. | 370/210 |
| 6,642,754 B1 | 11/2003 | Dobramysl et al. | |
| 6,867,665 B2 * | 3/2005 | Manku et al. | 333/171 |
| 6,873,916 B2 | 3/2005 | Kolosov et al. | |
| 6,906,532 B2 * | 6/2005 | Slates | 324/691 |
| 7,077,853 B2 * | 7/2006 | Kramer et al. | 606/169 |
| 2002/0049551 A1 * | 4/2002 | Friedman et al. | 702/65 |
| 2002/0103838 A1 * | 8/2002 | Kelly | 708/3 |
| 2002/0114428 A1 | 8/2002 | Nossing et al. | |

FOREIGN PATENT DOCUMENTS

| | | |
|---|---|---|
| CN | 1364340 A | 8/2002 |
| EP | 0338400 | 4/1989 |
| FR | 2737923 | 6/1995 |
| WO | WO 00/16428 | 3/2000 |
| WO | WO 03/040736 | 5/2003 |

OTHER PUBLICATIONS

Matsiev, L.F., "Application of flexural mechanical resonators to high throughput liquid characterization", Symyx Technologies, 2000 IEEE International Ultrasonics Symposium, pp. 427-434.

PCT/IE2004/000121 international search report.

* cited by examiner

MEASURING CIRCUIT AND A METHOD FOR DETERMINING A CHARACTERISTIC OF THE IMPEDANCE OF A COMPLEX IMPEDANCE ELEMENT FOR FACILITATING CHARACTERIZATION OF THE IMPEDANCE THEREOF

CROSS-REFERENCE TO RELATED APPLICATION

This application is a continuation of U.S. patent application Ser. No. 10/664,349, filed Sep. 17, 2003, which is hereby incorporated by reference.

FIELD OF THE INVENTION

The present invention relates to a measuring circuit for determining a characteristic of the impedance of a complex impedance element for facilitating characterization of the impedance thereof, and in particular, though not limited to such a measuring circuit for determining a characteristic of the impedance of an impedance based sensor for in turn facilitating measuring the change in impedance of such a sensor as a result of an external effect. The invention also relates to a method for determining a characteristic of the impedance of a complex impedance element for facilitating characterization of the impedance thereof, and in particular, though not limited to such a method for determining a characteristic of the impedance of an impedance based sensor for in turn facilitating measuring the change in impedance of such a sensor as a result of an external effect.

BACKGROUND TO THE INVENTION

Impedance based sensors are well known, and are commonly used for measuring variables such as temperature, pressure, volume, density, viscosity and the like where the impedance of the sensor is responsive to the particular variable being measured. Such impedance based sensors are also used in metal detectors, proximity sensors, for determining the proximity of one article to another, and the like. However, the impedance of many such sensors is complex, where the sensor includes a significant amount of reactance from capacitive or inductive elements. In such sensors the complex impedance comprises a resistive element, as well as the reactive elements. The reactive elements cause current through the sensor to either lead or lag the voltage. Complex impedance, which commonly is represented by the letter Z, can thus be represented by the equation Z=R+jX where R represented by the letter Z, can thus be represented by the equation Z=R+jX where R represents the resistive element of the impedance, and X is the reactive element. Complex impedance generally varies as a function of frequency, and accordingly, in order to determine the variable being measured, one must determine the frequency range over which measuring of the variable is to take place.

Examples of impedance based sensors in which the impedance is complex are piezo-electric resonators such as bar benders, disc benders, cantilevers, tuning forks, micro-machined membrane and torsion resonators. Such sensors are suitable for use in the measurement of viscosity and density of liquids, see for example a paper entitled "Application of flexural mechanical resonators to high throughput liquid characterization" of L. F. Matsiev, Proceedings of 2000 IEEE International Ultrasonics Symposium, Oct. 22-25, 2000, at page 427-434. Matsiev describes the use of such impedance based sensors in the measurement of density and viscosity of various liquids. The impedance of such sensors varies depending on the liquid, the density or viscosity of which is being measured.

Such impedance based sensors may also be used for measuring density and viscosity of gases, and for measuring many other variables, which have already been discussed above. In general, such impedance based sensors require that a stimulus frequency signal be continuously applied to the sensor in order to analyse a response signal from the sensor. Furthermore, in general it is necessary to be able to sweep the stimulus signal through a range of frequencies. The use of all such impedance based sensors requires the provision of a number of separate elements in order to permit measurement of density or viscosity of liquids to be measured using such sensors.

Firstly, a signal generator is required for generating the stimulus frequency signal for applying to the impedance based sensor. Additionally, the signal generator must be capable of sweeping the stimulus signal through a range of frequencies suitable for making the desired measurement. Secondly, a separate signal conditioning circuit, in general, is required for conditioning the stimulus signal prior to it being applied to the impedance based circuit. Thirdly, a separate signal analysing circuit is required for analysing response signals from the sensor in response to the stimulus signal. Fourthly, in general, a separate signal conditioning circuit is required for conditioning the response signals received from the sensor in response to the stimulus signals, prior to the response signals being analysed in the analysing circuit. After analysis of the response signals, measured values of the variable to be measured are then determined in a separate circuit. This results in many problems, in particular, each such circuit, namely, the signal generator, the signal conditioning circuits and the signal analysing circuit, each introduce errors into the respective signals. Matching of the components of the various separate circuits for minimising mismatch errors is also problematical. Furthermore, the errors introduced into the signals by each separate circuit are cumulative. Another problem with such arrangements is that the signal generator must be set up to provide the stimulus signal continuously at specific frequencies, and additionally, must be capable of being accurately swept through an appropriate range of frequencies, depending on the variable and the liquid which is being measured.

Additionally, in the testing of circuits, such as circuits with complex impedance, and in the testing of transmission lines, such as, for example, transmission lines used in local area networks, telecommunications and the like, both of which include complex impedance, it is necessary to determine characteristics of the impedance of such circuits and transmission lines. This also requires applying a stimulus signal of variable frequency continuously to the impedance circuit to be tested or the transmission line, and simultaneously analysing the response signal received from the impedance circuit or transmission line in response to the stimulus signal. The testing of such impedance circuits and transmission lines also requires the provision of a separate signal generator for generating the stimulus signal, a separate conditioning circuit for conditioning the stimulus signal prior to being applied to the circuit to be tested, a separate conditioning circuit for conditioning the signal received in response to the stimulus signal, and a separate analysing circuit for analysing the response signal received in response to the stimulus signal. By virtue of the fact that separate circuits must be used in determining the impedance characteristic or characteristics of such impedance circuits and transmission lines, similar problems arise in the measuring of the impedance characteristic as already described with reference to impedance based sensors.

There is therefore a need for a measuring circuit and a method for determining a characteristic of the impedance of a complex impedance element such as, for example, an impedance based sensor, a circuit or transmission line with complex impedance for facilitating characterization of the impedance thereof which overcomes these problems.

The present invention is directed towards providing such a measuring circuit and a method.

SUMMARY OF THE INVENTION

According to the invention there is provided a measuring circuit for determining a characteristic of the impedance of a complex impedance element for facilitating characterization of the impedance thereof, the measuring circuit being implemented on a single chip and comprising:

a signal generating circuit for generating an analog stimulus signal of selectable frequency for applying to the complex impedance element, a first receiving circuit for receiving an analog response signal from the complex impedance element in response to the stimulus signal, and for outputting a first output signal indicative of the characteristic of the impedance of the complex impedance element for use in characterization of the impedance of the complex impedance element.

In one embodiment of the invention the first receiving circuit is operable for outputting the first output signal to be indicative of one of a phase shift and an amplitude change of the stimulus signal caused by the complex impedance element. Preferably, the first receiving circuit is operable for selectively and alternately outputting the first output signal to be indicative of one of the phase shift and the amplitude change of the stimulus signal caused by the complex impedance element.

In another embodiment of the invention the first receiving circuit comprises a selectable first converting circuit for converting the analog response signal from the complex impedance element to a voltage signal suitable for comparison with the stimulus signal. Preferably, the first converting circuit comprises a selectable first root-mean-square (RMS) to DC voltage converter for converting the analog response signal from the complex impedance element to a DC voltage level corresponding to the RMS voltage value of the analog response signal.

In another embodiment of the invention the first receiving circuit comprises a current to voltage converting circuit for converting the analog response signal to an analog voltage signal.

Preferably, the first receiving circuit comprises a first analog-to-digital converter for converting the analog response signal from the complex impedance element to a digital signal for providing the first output signal as a digital signal.

In one embodiment of the invention the first receiving circuit comprises a first storing means for storing the first output signal in digital form.

In another embodiment of the invention a calibration circuit is on the chip for determining a calibration coefficient for calibrating the first receiving circuit, the calibration circuit comprising a coefficient storing means for storing the calibration coefficient. Preferably, a compensating circuit is provided on the chip for selectively applying the calibration coefficient to the first output signal for correcting the first output signal for errors introduced to the response signal by the first receiving circuit. Advantageously, a first coupling circuit is provided on the chip for selectively applying the stimulus signal to the first receiving circuit for calibration thereof.

In one embodiment of the invention a second receiving circuit is provided on the chip for receiving the analog stimulus signal and for outputting a second output signal representative of the stimulus signal for comparison with the first output signal for facilitating a determination of the characteristic of the impedance of the complex impedance element. Preferably, the second receiving circuit comprises a second analog-to-digital converter for converting the analog stimulus signal to a digital signal for providing the second output signal as a digital signal.

In one embodiment of the invention the second receiving circuit comprises a second storing means for storing the second output signal in digital form.

In some embodiments of the invention the second receiving circuit comprises a selectable second RMS to DC voltage converter for converting the analog stimulus signal to a DC signal of voltage level corresponding to the RMS value of the analog stimulus signal.

In one embodiment of the invention the second receiving circuit comprises an input signal switching circuit for selectively and alternately applying one of the analog stimulus signal and a signal from a temperature sensor to the second receiving circuit.

In another embodiment of the invention the temperature sensor is provided on the chip.

In a further embodiment of the invention a second coupling circuit is provided on the chip for selectively applying the analog stimulus signal to the second receiving circuit.

In one embodiment of the invention a signal processing circuit is provided on the chip for processing one or both of the first output signal and second output signal, and for outputting a third output signal resulting from the processing of the one or both of the first and second output signals.

Preferably, the signal generating circuit comprises a signal conditioning circuit for setting one of the voltage level and the current level of the stimulus signal.

In one embodiment of the invention the signal generating circuit comprises a direct digital synthesis frequency signal generator for generating the stimulus signal.

In one embodiment of the invention the direct digital synthesis frequency signal generator comprises:

a phase accumulator comprising a counter for incrementing or decrementing its count by a frequency determining digital word to or from a predetermined maximum count value in response to each cycle of a clock signal, a phase-to-amplitude converter for converting count values from the phase accumulator to digital words representative of amplitude values of the stimulus signal, and a digital-to-analog converter for converting the digital words from the phase-to-amplitude converter to the stimulus signal.

Preferably, the phase-to-amplitude converter comprises a look-up table with the digital words representative of the amplitude values of the stimulus signal cross-referenced with count values from zero to the predetermined maximum count value outputted by the phase accumulator.

Advantageously, the stimulus signal generated by the signal generator is of sinusoidal waveform.

In one embodiment of the invention a first bypass circuit is provided for applying the count values from the phase accumulator directly to the digital-to-analog converter so that the stimulus signal provided from the digital-to-analog converter is of triangular waveform.

In another embodiment of the invention a second bypass circuit bypasses the digital-to-analog converter for applying the count values from the phase accumulator to a comparator for comparing the most significant bit of the count values with a reference value for providing the stimulus signal as a square waveform.

In a further embodiment of the invention the direct digital synthesis frequency signal generator comprises an adder for summing a phase offset digital word to each count value outputted by the phase accumulator for offsetting the phase of the stimulus signal by a predetermined offset. Preferably, the phase offset digital word is selectable for selecting the phase offset of the stimulus signal. Advantageously, the frequency determining digital word is selectable for selecting the frequency of the stimulus signal.

In one embodiment of the invention, the measuring circuit is implemented as an integrated circuit.

Additionally the invention provides a method for determining a characteristic of the impedance of a complex impedance element for facilitating characterization of the impedance thereof, the method comprising the steps of:

providing a signal generating circuit on a single chip for generating an analog stimulus signal of selectable frequency for applying to the complex impedance element, providing a first receiving circuit on the single chip for receiving an analog response signal from the complex impedance element in response to the stimulus signal and for outputting a first output signal indicative of the characteristic of the impedance of the complex impedance element for use in characterization of the impedance of the complex impedance element, operating the signal generating circuit for applying the stimulus signal to the complex impedance element, applying an analog response signal from the complex impedance element, responsive to the stimulus signal, to the first receiving circuit, and operating the first receiving circuit for outputting the first output signal indicative of the characteristic of the impedance of the complex impedance element.

ADVANTAGES OF THE INVENTION

The advantages of the invention are many. By virtue of the fact that the measuring circuit is implemented on a single chip, errors in the first output signal outputted by the measuring circuit are minimised. This is due to the fact that there is little or no accumulation of signal errors between the signal generating circuit and the first receiving circuit. Additionally, by virtue of the fact that the measuring circuit is implemented on a single chip, the respective components of the signal generating circuit and the first receiving circuit can be relatively accurately matched. Furthermore, when the measuring circuit is provided with a second receiving circuit, the components in the second receiving circuit can likewise be relatively accurately matched with the components in the signal generating circuit and the first receiving circuit. Thus, mismatch of the respective circuits of the measuring circuit due to ratiometric operation of the measuring circuit are minimised. Additionally, any drift in the measuring circuit can be minimised. Matching of the components of the signal generating circuit, and the first and second receiving circuits is further facilitated when the measuring circuit is implemented as an integrated circuit.

The measuring circuit according to the invention, in particular, facilitates the phase shift and amplitude change in a response signal from a complex impedance element, which is responsive to a stimulus signal applied to the complex impedance element to be readily and easily determined. Additionally, the frequency response of the complex impedance element can also be readily easily determined.

Additionally, the provision of the measuring circuit on a single chip facilitates synchronous timing of the entire measuring circuit. Furthermore, R-C timing components such as glitching and high frequency interference which arise where discrete elements are used are substantially eliminated in the measuring circuit according to the invention. Such R-C timing components in prior art circuits may result from track resistance and associated capacitance and inductance of the tracks of a printed circuit board on which the discrete elements are mounted. Such R-C components can be particularly problematical at relatively high frequencies, and result in phase errors as well as other errors. Accordingly, by providing the measuring circuit according to the invention as an integrated circuit on a single chip, such R-C timing components are effectively eliminated.

Furthermore, by providing the measuring circuit on a single chip, the board area requirement of a printed circuit board on which the measuring circuit is provided is significantly less than the board area requirement of prior art arrangements where discrete components are mounted on a printed circuit board.

By implementing the signal generating circuit as a direct digital synthesis frequency signal generator, the performance of the measuring circuit according to the invention is significantly enhanced. Additionally, the measuring circuit is suitable for determining the frequency response of a wide range of complex impedance elements, for example, a wide range of complex impedance sensors, and complex impedance circuits, and in particular, the provision of the direct digital synthesis frequency signal generator allows the measuring circuit to generate stimulus signals of a wide breadth of frequency ranges with range of frequency resolution. Additionally, the implementation of the signal generating circuit as a direct digital synthesis frequency signal generator permits the frequency range of the stimulus signal to be readily easily digitally selected, and the resolution of the frequency steps through which the stimulus signal is to be swept can likewise be readily easily digitally selected. The provision of the adder in the frequency generator for adding a phase offset digital word to the count from the phase accumulator provides the further advantage that the phase of the stimulus signal can be readily easily offset by a desired selectable amount.

By appropriately selecting the bit size of the counter of the phase accumulator, and the bit size of the digital-to-analog converter of the signal generator, relatively high frequency resolution can be achieved.

The invention and its advantages will be more clearly understood from the following description of an embodiment thereof, which is given solely as a non-limiting example, with reference to the accompanying drawings.

DETAILED DESCRIPTION OF THE INVENTION

Figure 1:
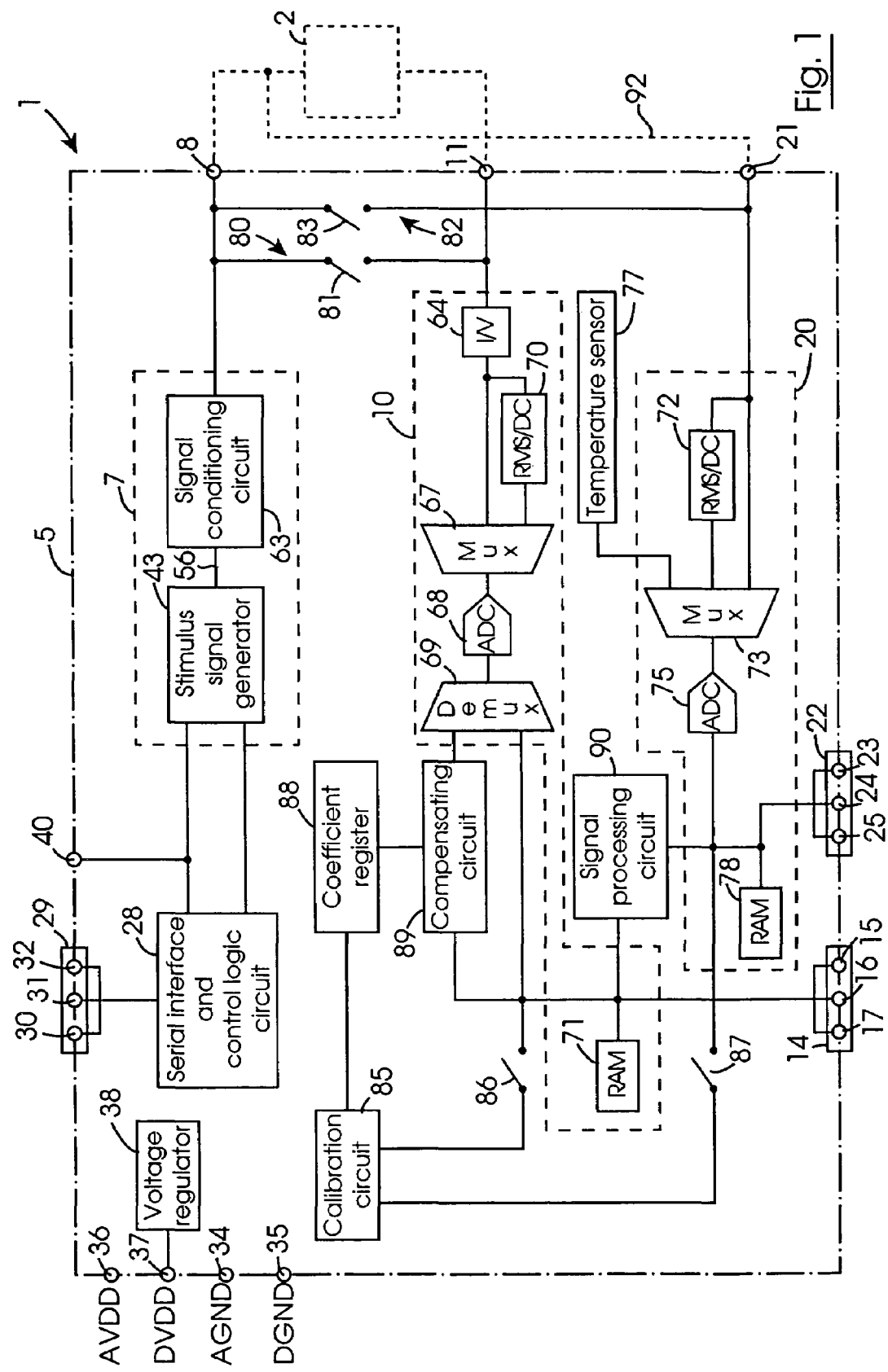
FIG. 1 is a block diagram of a measuring circuit according to the invention for determining a characteristic of the impedance of a complex impedance circuit for facilitating characterization of the impedance thereof.

Referring to the drawings, there is illustrated a measuring circuit according to the invention, indicated generally by the reference numeral 1, for determining a characteristic of the impedance of a complex impedance element, namely, a complex impedance circuit 2 for facilitating characterization of the impedance of the complex impedance circuit 2. In this embodiment of the invention the measuring circuit 1 applies an analog voltage stimulus signal of selectable frequencies as will be described below to the complex impedance circuit 2, and is selectively operable for outputting a first output signal which is indicative of a phase shift and an amplitude change in the stimulus signal caused by the complex impedance of the circuit 2 at respective different frequencies. The complex impedance circuit 2 may be any impedance circuit or element in which the impedance is complex, for example, a circuit with complex impedance, a characteristic of the impedance of which is to be determined, or a transmission cable. Additionally, the complex impedance circuit 2 may be an impedance based sensor, and in particular, may be an impedance based sensor of the type for measuring viscosity or density of a liquid or gas, such as, for example, a piezo-electric resonator comprising a bar bender, a disc bender, a cantilever, a tuning fork, a micro-machined membrane or a torsion resonator. Such impedance based sensors will be well known to those skilled in the art, and it is not intended to describe such sensors in further detail. A description of such impedance based sensors and their uses is given in the article entitled "Application of flexural mechanical resonators to high throughput liquid characterization" by L. F. Matsiev, which has been referred to above.

The measuring circuit 1 is implemented as an integrated circuit by CMOS technology on a single chip 5, and comprises a signal generating circuit 7 for generating three different types of voltage stimulus signals, each of variable frequency for applying to the complex impedance circuit 2 through an output terminal 8. The three different types of stimulus signals which are generated by the signal generating circuit 7 are sine waves of variable frequency, square waves of variable frequency and triangular waves of variable frequency.

A first receiving circuit 10 receives an analog response signal from the complex impedance circuit 2 in response to each stimulus signal through an input terminal 11. The first receiving circuit 10, as will be described below, conditions and converts each analog response signal to digital form so that the first output signal is provided in digital form. The first output signal is read out from the first receiving circuit 10 through a first digital output port 14. The first digital output port 14 comprises a first serial data output terminal 15, a first clock signal terminal 16 and a first read enable terminal 17.

A second receiving circuit 20 is provided for receiving the analog stimulus signal through a second input terminal 21. The second receiving circuit 20, as will be described below, conditions and converts the analog stimulus signal to a second output signal in digital form which is read out from the second receiving circuit 20 on a second digital output port 22 which comprises a second serial data output terminal 23, a second clock signal terminal 24 and a second read enable terminal 25.

By providing the response signal and the stimulus signal simultaneously in digital form on the first and second digital output ports 14 and 22, respectively, the response and stimulus signals can be readily compared with each other for determining the phase shift in the response signal caused by the complex impedance circuit 2. Additionally, the provision of the response signal in digital form on the first output port 14 permits the change in the voltage of the response signal from the complex impedance circuit 2 resulting from a change in frequency of the stimulus signal to be determined. Furthermore, the provision of the stimulus signal and the corresponding response signal simultaneously on the first and second output ports 14 and 22, respectively, facilitates other comparisons to be made between the stimulus and response signals for determining other characteristics of the impedance of the complex impedance circuit 2 for further facilitating characterization of the impedance of the complex impedance circuit 2.

A digital interface and control logic circuit 28 controls the operation of the measuring circuit 1, and in particular, the signal generating circuit 7 as will be described below. A digital input port 29 facilitates the inputting of data in digital form into the interface and control logic circuit 28 for selecting the type of stimulus signal to be generated, the frequency range through which the stimulus signal is to be swept, as well as the frequency step size between the frequency steps through which the stimulus signal is to be swept, and also for selecting the phase offset, if any, at which the stimulus signal is to be generated. A desired maximum amplitude value with which the stimulus signal is to be generated is also entered into the control circuit 28 through the digital input port. These aspects of the measuring circuit are discussed in more detail below. The digital input port 29 comprises a serial data input terminal 30, a serial clock terminal 31 and a frame sync terminal 32, and may be adapted for communicating in $I^2C$, SPI, or any other communications protocol. However, if desired, the digital input port may be provided as a parallel port, and this will be dependent on the interface and control circuit 28.

Analog and digital ground terminals 34 and 35 provide external ground for analog parts of the circuitry, and digital parts of the measuring circuit 1, respectively. A first supply voltage terminal 36 is provided for receiving a 5 volt DC supply for supplying the analog parts of the measuring circuit 1. A second supply voltage terminal 37 is provided for receiving a supply voltage of approximately 2.7 volts for supplying the digital parts of the measuring circuit 1. A voltage regulator 38 regulates the supply voltage received on the second terminal 37 for outputting a 2.5 volt regulated supply for the digital parts of the measuring circuit 1. However, the voltages provided on the supply voltage terminals 36 and 37 will be dependent on the digital and analog parts of the measuring circuit. A master clock terminal 40 is provided for receiving an external master clock signal for the signal generating circuit 7 from which the frequency of the stimulus signals are derived. The external master clock signal applied to the master clock terminal 40 may be of any suitable frequency, however, in this embodiment of the invention a 50 MHz external clock signal is applied to the master clock terminal 40. Clock signals for clocking the digital parts of the measuring circuit 1 are derived from the master clock signal by the interface and control circuit 28 as will be understood by those skilled in the art.

Figure 2:
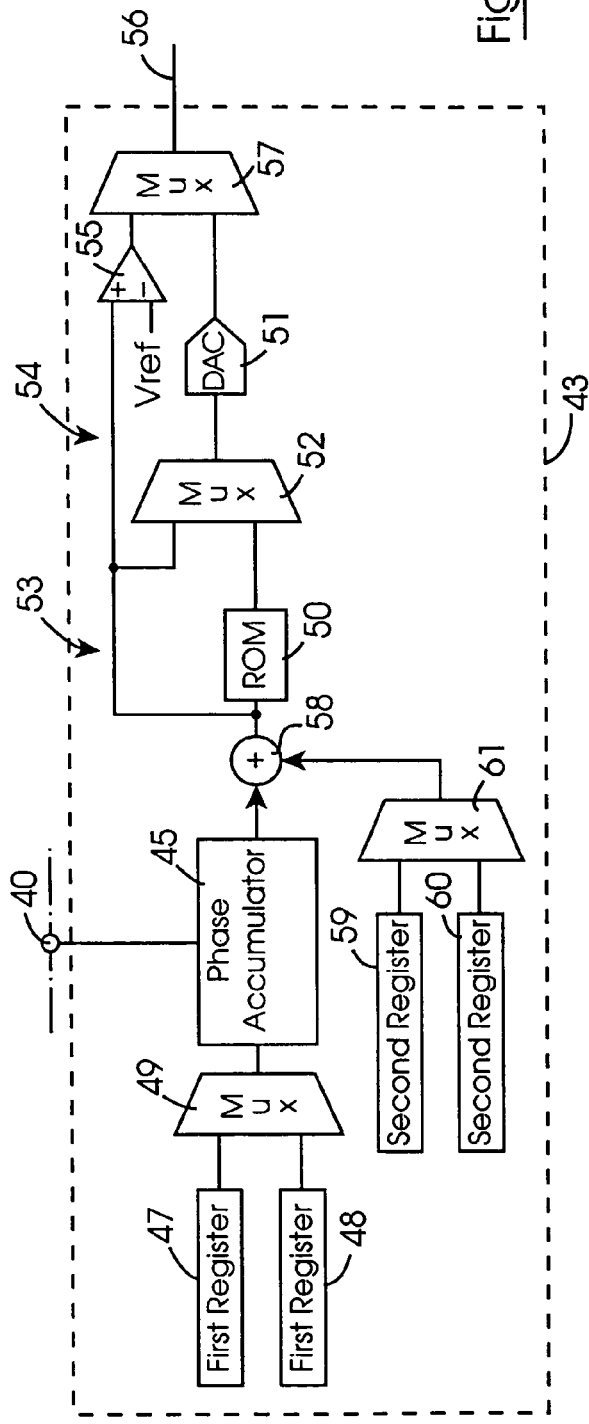
FIG. 2 is a more detailed block representation of a portion of the measuring circuit of FIG. 1.

Referring now to FIG. 2, the signal generating circuit 7 comprises a signal generator 43 which in this embodiment of the invention is implemented as a direct digital synthesis frequency signal generator for generating the stimulus signals of the three types of variable frequency from the master clock signal. The signal generator 43 comprises a phase accumulator 45 which in this embodiment of the invention is implemented as a 32 bit counter which on each cycle of the master clock signal increments its count by a frequency determining digital word. A pair of first storing registers 47 and 48 store two frequency determining digital words for loading into the phase accumulator 45 for determining the frequency of the stimulus signal. The frequency determining digital words are sequentially written to the first storing registers 47 and 48 by the control circuit 28, and the frequency determining digital words are alternately loaded from the first storing registers 47 and 48 for stepping the frequency of the stimulus signals sequentially through the frequency steps. In other words, the frequency determining digital word for the current frequency of the stimulus signal is loaded from one of the first registers 47 and 48, while the frequency determining digital word for the next frequency value of the stimulus signal is loaded into the other of the first registers 47 and 48. This thus avoids delays as the frequency of the stimulus signal is being changed from one frequency value to the next frequency value. A first multiplexer 49 under the control of the control circuit 28 switches the appropriate one of the first registers 47 and 48 to the phase accumulator 45.

A read-only memory (ROM) 50 stores a look-up table, which cross-references the count values outputted by the phase accumulator 45 from zero to its maximum count value with corresponding 10 bit digital words representative of amplitude values of a sine wave from which the stimulus signal in the form of a sine wave is derived. On each clock cycle of the master clock, the digital word representative of an amplitude value corresponding to the count value outputted by the phase accumulator 45 is read from the ROM 50, and loaded under the control of the control circuit 28 into a digital-to-analog converter (DAC) 51, through a second multiplexer 52. The DAC 51 in turn outputs an analog voltage of corresponding amplitude value. In this embodiment of the invention the DAC 51 is a 10 bit DAC, and the 32 bit output count values from the phase accumulator 45 are truncated to the twelve most significant bits, since using the full 32 bits of the phase accumulator 45 would be impractical and unnecessary, and would require a look-up table with $2^{32}$ entries in the ROM 50. The ROM 50 in this embodiment of the invention stores digital words representative of amplitude values of one quadrant of a sine wave, and the quadrant of the sine wave is determined from the first two most significant bits of the count values outputted by the phase accumulator 45.

A first bypass circuit 53 bypasses the ROM 50 for loading the ten most significant bits of the digital count values directly from the phase accumulator 45 into the DAC 51 through the second multiplexer 52, for in turn generating the stimulus signal as a triangular waveform. The frequency of the triangular wave is similar to the frequency of the sine wave which would have been generated by the DAC 51 if the ROM 50 had not been bypassed.

A second bypass circuit 54 bypasses the ROM 50 and the DAC 51 for applying the most significant bit of the count values from the phase accumulator 45 to the positive input of a comparator 55. A reference voltage $V_{ref}$, which is approximately half the value of the regulated supply voltage from the voltage regulator 38, is applied to the negative input of the comparator 55, and the comparator 55 in response to the most significant bit of the count values from the phase accumulator 45 outputs the stimulus signal as a square wave, which is applied on an output line 56 of the signal generating circuit 7 through a third multiplexer 57. The frequency of the square wave voltage signal is similar to the frequency of the sine wave which would be generated by the DAC 51 if the ROM 50 were not bypassed.

The second and third multiplexers 52 and 57 are operated under the control of the interface and control circuit 28 in response to the type of stimulus signal selected. Where a stimulus signal of sine waveform is required, the second multiplexer 52 is operated for applying the digital words representative of the amplitude of the sine wave to the DAC 51, and the third multiplexer 57 is operated for applying the output voltage of the DAC 51 to the output line 56. To provide the stimulus signal of triangular waveform the second multiplexer 52 is operated for applying the count values from the phase accumulator 45 directly through the first bypass circuit 53 to the DAC 51, and the third multiplexer 57 is operated for applying the output voltage of the DAC 51 to the output line 56. To provide the stimulus signal as a square waveform the third multiplexer 57 is operated for applying the output from the comparator 55 on the output line 56.

An adder 58 located after the phase accumulator 45 sums an offset determining digital word with each output count of the phase accumulator 45 for causing the stimulus signal to be generated with a phase offset. A pair of fourteen bit second storing registers 59 and 60 store respective offset determining digital words, and a fourth multiplexer 61 under the control of the control circuit 28 selectively switches the second registers 59 and 60 to the adder 58. The offset determining digital words are written to the respective second registers 59 and 60 by the control circuit 28 in response to the desired phase offsets inputted to the control circuit 28 through the digital input port 29. In this embodiment of the invention the second registers 59 and 60 alternately store the offset digital words for the current phase offset required, and the next phase offset required.

The frequency signal outputted by the signal generator 43 on the output line 56 is applied to a signal conditioning circuit 63 which sets the maximum voltage amplitude of the stimulus signal which is to be applied to the complex impedance circuit 2 through the output terminal 8. In this embodiment of the invention the signal conditioning circuit 63 is provided by a programmable gain element, and is operated under the control of the control circuit 28 to provide the stimulus signal of a desired maximum voltage amplitude value.

Figure 3:
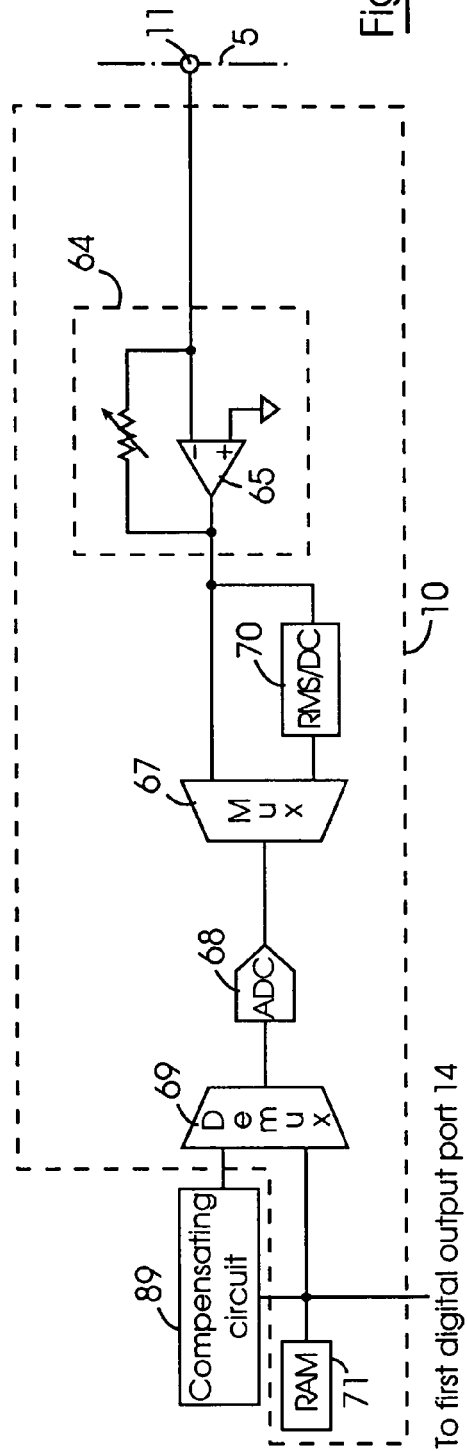
FIG. 3 is a more detailed block representation of another portion of the measuring circuit of FIG. 1.

Referring now to FIGS. 1 and 3, the first receiving circuit 10 comprises an analog current to voltage converter 64 for converting the response signal from the complex impedance circuit 2, which typically will be an analog current signal, to an analog voltage signal. In this embodiment of the invention the current to voltage converter 64 is implemented by an operational amplifier (op-amp) 65. The analog response voltage signal is selectively applied through a fifth multiplexer 67 to a first analog-to-digital converter 68 which converts the response voltage signal to digital values, thus providing the first output signal in digital form. The first analog-to-digital converter 68 is a twelve bit analog-to-digital converter, and the digital values of the first output signal are read from the first analog-to-digital converter 68 through a demultiplexer 69 and the first digital output port 14. A first root-mean-square (RMS) to DC voltage converting circuit 70 converts the response voltage signal to a DC voltage level signal corresponding to the RMS voltage of the response voltage signal, and the DC voltage level from the first converting circuit 70 is selectively applied to the first analog-to-digital converter 68 through the fifth multiplexer 67. The fifth multiplexer 67 is operated under the control of the control circuit 28, for selectively applying one or other of the analog voltage response signal from the current to voltage converter 64 and the DC voltage level signal from the first RMS to DC voltage converting circuit 70 to the first analog-to-digital converter 68.

Where it is desired that the first output signal read through the first digital output port 14 is to be indicative of the phase shift of the response signal from the stimulus signal caused by the complex impedance circuit 2, the fifth multiplexer 67 is operated for applying the response voltage signal from the current to voltage converter 64 to the first analog-to-digital converter 68. Alternatively, where it is desired that the first output signal read through the first digital output port 14 is to be indicative of an amplitude change to the stimulus signal caused by the complex impedance circuit 2, the fifth multiplexer 67 is operated under the control of the interface and control circuit 28 for applying the DC voltage level signal from the first RMS to DC voltage converting circuit 70 to the first analog-to-digital converter 68.

A first storing means comprising a first RAM 71 stores the digital values of the first output signal from the first analog-to-digital converter 68 for facilitating subsequent reading out of the first output signal. The stored digital values of the first output signal are read from the first RAM 71 through the first digital output port 14.

Referring again to FIG. 1, the second receiving circuit 20 comprises a second RMS to DC voltage converter 72 which converts the stimulus signal to a DC voltage level signal which corresponds to the RMS voltage of the stimulus signal. A sixth multiplexer 73 under the control of the control circuit 28 selectively applies the DC voltage signal from the second RMS to DC voltage converter 72 or the stimulus signal directly to a second analog-to-digital converter 75, which in turn provides the second output signal in digital form. The second analog-to-digital converter 75 is a twelve bit analog-to-digital converter, and the second digital output signal is read from the second analog-to-digital converter 75 through the second digital output port 22.

The sixth multiplexer 73 is operated under the control of the control circuit 28 for applying the stimulus signal directly to the second analog-to-digital converter 75, when the fifth multiplexer 67 of the first receiving circuit 10 is operated for applying the response voltage signal from the current to voltage converter 64 to the first analog-to-digital converter 68, for facilitating comparison of the phase shift of the response signal from the stimulus signal. The sixth multiplexer 73 is operated under the control of the control circuit 28 for applying the DC voltage signal from the second RMS to DC voltage converter 72 to the second analog-to-digital converter 75, should it be desired to compare the DC voltage levels of the first and second output signals, when the fifth multiplexer 67 is operated for applying the DC voltage signal from the first RMS to DC voltage converting circuit 70 to the first analog-to-digital converter 68.

The sixth multiplexer 73 also under the control of the control circuit 28 selectively applies an analog temperature signal from an on-chip temperature sensor 77 to the second analog-to-digital converter 75, which converts the temperature signal to digital form, for facilitating reading out of the temperature of the chip 5 through the second digital output port 22. The temperature signal read out through the second digital output port 22 may be used for subsequently correcting the first and second digital output signals for temperature offsets. The temperature sensor 77 may be of any desired construction, and typically, would be provided by a pair of diode connected bipolar transistors operating at different current densities in the form of a Brokaw cell. Appropriate current sources for providing currents to the Brokaw cell would also be provided. Alternatively, the temperature sensor 77 may be replaced by an input terminal which would receive an analog temperature signal from an externally located temperature sensor, which may be located in the complex impedance circuit 2 for facilitating subsequent correction of the first digital output signal read out through the first digital output port 14 for temperature offset.

A second storing means comprising a second RAM 78 stores the digital values of the second digital output signal from the second analog-to-digital converter 75 for facilitating subsequent reading out of the second digital output signal from the second receiving circuit 20 through the second digital output port 22.

A first coupling circuit 80 formed in the chip 5 selectively couples the first output terminal 8 of the signal generating circuit 7 with the first input terminal 11 of the first receiving circuit 10 through a first CMOS switch 81. A second coupling circuit 82 also formed in the chip 5 selectively couples the output terminal 8 of the signal generating circuit 7 with the second input terminal 21 of the second receiving circuit 20 through a second CMOS switch 83. The first and second CMOS switches 81 and 83 are selectively operated under the control of the control circuit 28 for applying the stimulus signal directly to the first and second receiving circuits 10 and 20.

A calibrating circuit 85 formed in the chip 5 is coupled to the digital outputs of the first and second analog-to-digital converters 68 and 75, respectively, through third and fourth CMOS switches 86 and 87, respectively. The first analog-to-digital converter 68 is coupled to the calibration circuit 85 through the demultiplexer 69. The third and fourth switches 86 and 87 are operated in conjunction with the first and second switches 81 and 83 under the control of the control circuit 28 during calibration of the first receiving circuit 10. To calibrate the first receiving circuit 10 the first and second CMOS switches 81 and 83 are closed, as are the third and fourth CMOS switches 86 and 87. A stimulus signal is generated by the signal generating circuit 7, and is applied through the first and second coupling circuits 80 and 82 to the first and second receiving circuits 10 and 20. The stimulus signal is applied through the current and voltage converter 64 to the first analog-to-digital converter 68, and is applied directly to the second analog-to-digital converter 75. The difference in the digital values of the outputs of the first and second analog-to-digital converters 68 and 75 are determined in the calibration circuit 85, to provide a calibration coefficient for the first receiving circuit for compensating for errors introduced by the current to voltage converter 64 and the first analog-to-digital converter 68. The calibration coefficient is stored in a calibration coefficient storing register 88.

A compensating circuit 89 formed on the chip 5 is provided for adding the calibration coefficient stored in the register 88 to the output from the first analog-to-digital converter 68, for compensating for errors introduced to the response signal by the first receiving circuit 10. When it is desired to compensate for the errors introduced to the response signal, the demultiplexer 69 is operated under the control of the control circuit 28 so that the first digital output signal from the first analog-to-digital converter 68 is read through the compensating circuit 89. Accordingly, by appropriately programming the control circuit 28 through the digital input port 29 for in turn controlling the operation of the demultiplexer 69, the first digital output signal may be read directly from the first analog-to-digital converter 68 without error compensation, or through the compensating circuit 89 with error compensation. Similarly, the digital values of the first digital output signal may be written to the first RAM 71 with or without compensation for errors introduced by the first receiving circuit 10.

A signal processing circuit 90 which is programmable through the interface and control circuit 28 for carrying out mathematical computations on one or both of the first and second digital output signal for comparison or other purposes. For example, the signal processing circuit may be programmable for carrying out fast Fourier transforms on either or both of the first and second digital output signals. Third digital output signals resulting from the processing of one or both of the first and second digital output signals in the signal processing circuit 90 may be read through the first digital output port 14 or the second digital output port 22, and may be written to the first RAM 71 or the second RAM 78 for subsequent reading out through the first or second digital output ports 14 or 22.

Although not illustrated, the various components of the measuring circuit 1 are appropriately clocked by the control circuit 28, as will be well understood by those skilled in the art.

In use, the frequency range and the frequency steps through which the stimulus signal is to be stepped, are inputted through the digital input port 29 to the control circuit 28. Additionally, the desired maximum voltage amplitude of the stimulus signal is also entered through the digital input port 29 to the control circuit 28. The control circuit 28 is also programmed through the digital input port 29 to operate the second and third multiplexers 52 and 57 depending on whether the stimulus signal is to be provided in the form of a sine wave, a triangular wave or a square wave. If the stimulus signal is to be generated at the various frequencies with one or more phase offsets, the desired phase offsets are also entered through the digital input port 29 to the control circuit 28. The control circuit 28 is also programmed through the digital input port 29 for operating the fifth and sixth multiplexer 67 and 73 for providing the first and second digital output signals as being indicative of either the phase shift or amplitude change in the response signal caused by the complex impedance circuit 2. The control circuit 28 is also programmed to operate the demultiplexer 69 depending on whether the first digital output signal is to be compensated for errors introduced by the first receiving circuit 10. The control circuit is programmed also to store or otherwise the digital values of the first and second digital output signals in the first and second RAMs 71 and 78. If either or both of the first and second digital output signals are to be processed in the signal processing circuit 90, the signal processing circuit 90 is appropriately programmed through the interface and control circuit 28.

Assuming the measuring circuit 1 has already been calibrated, the measuring circuit 1 is ready for use and the first, third and fourth switches 81, 86 and 87 are operated in an open circuit state. The second switch 83 is operated in the closed circuit state for applying the stimulus signal to the second receiving circuit 20 through the second coupling circuit 82. The complex impedance circuit 2 is connected to the measuring circuit 1 so that the stimulus signal is applied to the complex impedance circuit 2 through the output terminal 8, and the response signal from the complex impedance circuit 2 is applied to the first input terminal 11. If desired, instead of applying the stimulus signal to the second receiving circuit 20 directly through the second coupling circuit 82, the stimulus signal may be applied to the second input terminal 21 by an external line coupling the input side of the complex impedance circuit 2 to the second input terminal 21, by, for example, the external line 92 shown in broken lines in FIG. 1. Thereafter, depending on the setting of the fifth and sixth multiplexers 67 and 73, either the response signal from the current to voltage converter 64 and the stimulus signal are applied directly to the first and second analog-to-digital converters 68 and 75, respectively, and the first and second digital output signals are read from the first and second analog-to-digital converters 68 and 75, respectively. Depending on the setting of the demultiplexer 69, the first digital output signal may be read from the first analog-to-digital converter 68 either directly or through the compensating circuit 89. Alternatively, the fifth and sixth multiplexers 67 and 73 may be set for applying the DC voltage level of the response and stimulus signals to the first and second analog-to-digital converters 68 and 75.

The response and stimulus signals read out from the measuring circuit 1 can then be compared in any suitable comparing circuit. Alternatively, if the digital values of the first and second digital output signals are stored in the first and second RAMs 71 and 78, the first and second digital output signals can be read from the respective first and second RAMs 71 and 78 through the first and second digital output ports 14 and 22, respectively. On the other hand, if one or both of the first and second digital output signals are processed in the signal processing circuit 90, the third digital output signal resulting from the signal processing of the one or both of the first and second digital output signal may be written to the first RAM 71 or read for subsequent reading through the first digital output port 14, or may be read directly through the first digital output port 14 from the signal processing circuit 90.

In general, it is envisaged that the sixth multiplexer 73 will only be operated either initially or initially and periodically during operation of the measuring circuit 1 for facilitating reading out of the temperature from the temperature sensor 77 which is converted to digital form by the second analog-to-digital converter 75.

Prior to operation of the measuring circuit 1, the measuring circuit 1 is calibrated for errors introduced by the current to voltage converter 64 and the first analog-to-digital converter 68 as already described.

It is envisaged that the first, second or third digital output signals stored in the first and second RAMs 71 and 78 may be read out through the interface and control circuit 28 by providing a suitable serial or parallel output port from the interface and control circuit 28.

While the signal generator has been described as being a direct digital synthesis frequency signal generator, any other suitable signal generator may be used.

By providing the signal generating circuit, the first receiving circuit and the second receiving circuit, where a second receiving circuit is provided, on the same chip, the same master clock signal can be used for the three circuits, and synchronisation is ensured between the signal generating circuit and the first and second receiving circuits, and furthermore, the matching of the signal generating circuit and the first and second receiving circuits is achieved, and accumulation of errors through the respective circuits is avoided.

While the measuring circuit has been described as comprising a second receiving circuit, in certain cases, it is envisaged that the second receiving circuit may be omitted.

Needless to say, while a particular implementation of a direct digital synthesis frequency signal generating circuit has been described, other suitable implementations of a direct digital synthesis frequency signal generating circuit could be used.

While the measuring circuit has been described as comprising a temperature sensor located in the chip, while this is preferable and indeed advantageous, it is not essential, and furthermore, it is not essential that the sixth multiplexer 73 be adapted for switching a temperature signal to the second analog-to-digital converter 75.

While the phase accumulator, the ROM and the DAC of the direct digital synthesiser have been described as being of specific bit sizes, the phase accumulator, the ROM and the DAC may be provided to be of any suitable bit size. It will also be appreciated that the first and second analog-to-digital converters may also be provided of any suitable or desired bit size.

While the signal generating circuit has been described as being suitable for generating stimulus signals of specific waveforms, it will be appreciated that stimulus signals of other waveforms could be generated. Furthermore, it will be appreciated that while the stimulus signal has been described as being a voltage signal, the stimulus signal could be a current signal, and in which case, the signal conditioning circuit 63 would be adapted to set the current level of the stimulus signal.

The invention claimed is:

1. A measuring circuit for determining a characteristic of the impedance of a complex impedance element for facilitating characterization of the impedance thereof, the measuring circuit being implemented on a single chip and comprising:
a signal generating circuit for generating an analog stimulus signal of selectable frequency for applying to the complex impedance element; and
a first receiving circuit for receiving an analog response signal from the complex impedance element in response to the stimulus signal, and for producing a first output signal indicative of the characteristic of the impedance of the complex impedance element; and
a signal processing circuit for carrying out a Fast Fourier Transform on the first output signal to produce a third output signal for use in characterization of the impedance of the complex impedance element.

2. A measuring circuit as claimed in claim 1 in which the first receiving circuit is operable for outputting the first output signal to be indicative of one of a phase shift and an amplitude change of the stimulus signal caused by the complex impedance element.

3. A measuring circuit as claimed in claim 2 in which the first receiving circuit is operable for selectively and alternately outputting the first output signal to be indicative of one of the phase shift and the amplitude change of the stimulus signal caused by the complex impedance element.

4. A measuring circuit as claimed in claim 2 in which the first receiving circuit comprises a selectable first converting circuit for converting the analog response signal from the complex impedance element to a voltage signal suitable for comparison with the stimulus signal.

5. A measuring circuit as claimed in claim 4 in which the first converting circuit comprises a selectable first root-mean-square (RMS) to DC voltage converter for converting the analog response signal from the complex impedance element to a DC voltage level corresponding to the RMS voltage value of the analog response signal.

6. A measuring circuit as claimed in claim 1 in which the first receiving circuit comprises a current to voltage converting circuit for converting the analog response signal to an analog voltage signal.

7. A measuring circuit as claimed in claim 1 in which the first receiving circuit comprises a first analog-to-digital converter for converting the analog response signal from the complex impedance element to a digital signal for providing the first output signal as a digital signal.

8. A measuring circuit as claimed in claim 7 in which the first receiving circuit comprises a first storing means for storing the first output signal in digital form.

9. A measuring circuit as claimed in claim 1 in which a calibration circuit is provided on the chip for determining a calibration coefficient for calibrating the first receiving circuit, the calibration circuit comprising a coefficient storing means for storing the calibration coefficient.

10. A measuring circuit as claimed in claim 9 in which a compensating circuit is provided on the chip for selectively applying the calibration coefficient to the first output signal for correcting the first output signal for errors introduced to the response signal by the first receiving circuit.

11. A measuring circuit as claimed in claim 9 in which a first coupling circuit is provided on the chip for selectively applying the stimulus signal to the first receiving circuit for calibration thereof.

12. A measuring circuit as claimed in claim 1 in which a second receiving circuit is provided on the chip for receiving the analog stimulus signal and for outputting a second output signal representative of the stimulus signal for comparison with the first output signal for facilitating a determination of the characteristic of the impedance of the complex impedance element.

13. A measuring circuit as claimed in claim 12 in which the second receiving circuit comprises a second analog-to-digital converter for converting the analog stimulus signal to a digital signal for providing the second output signal as a digital signal.

14. A measuring circuit as claimed in claim 13 in which the second receiving circuit comprises a second storing means for storing the second output signal in digital form.

15. A measuring circuit as claimed in claim 12 in which the second receiving circuit comprises a selectable second RMS to DC voltage converter for converting the analog stimulus signal to a DC signal of voltage level corresponding to the RMS value of the analog stimulus signal.

16. A measuring circuit as claimed in claim 12 in which the second receiving circuit comprises an input signal switching circuit for selectively and alternately applying one of the analog stimulus signal and a signal from a temperature sensor to the second receiving circuit.

17. A measuring circuit as claimed in claim 16 in which the temperature sensor is provided on the chip.

18. A measuring circuit as claimed in claim 12 in which a second coupling circuit is provided on the chip for selectively applying the analog stimulus signal to the second receiving circuit.

19. A measuring circuit as claimed in claim 12 in which the signal processing circuit is adapted for processing the second output signal.

20. A measuring circuit as claimed in claim 1 or claim 15 in which the signal generating circuit comprises a signal conditioning circuit for setting one of the voltage level and the current level of the stimulus signal.

21. A measuring circuit as claimed in claim 1 or claim 15 in which the signal generating circuit comprises a direct digital synthesis frequency signal generator for generating the stimulus signal.

22. A measuring circuit as claimed in claim 21 in which the direct digital synthesis frequency signal generator comprises:
a phase accumulator comprising a counter for incrementing or decrementing its count by a frequency determining digital word to or from a predetermined maximum count value in response to each cycle of a clock signal,
a phase-to-amplitude converter for converting count values from the phase accumulator to digital words representative of amplitude values of the stimulus signal, and
a digital-to-analog converter for converting the digital words from the phase-to-amplitude converter to the stimulus signal.

23. A measuring circuit as claimed in claim 22 in which the phase-to-amplitude converter comprises a look-up table with the digital words representative of the amplitude values of the stimulus signal cross-referenced with count values from zero to the predetermined maximum count value outputted by the phase accumulator.

24. A measuring circuit as claimed in claim 22 in which the stimulus signal generated by the signal generator is of sinusoidal waveform.

25. A measuring circuit as claimed in claim 22 in which a first bypass circuit is provided for applying the count values from the phase accumulator directly to the digital-to-analog converter so that the stimulus signal provided from the digital-to-analog converter is of triangular waveform.

26. A measuring circuit as claimed in claim 22 in which a second bypass circuit bypasses the digital-to-analog converter for applying the count values from the phase accumulator to a comparator for comparing the most significant bit of the count values with a reference value for providing the stimulus signal as a square waveform.

27. A measuring circuit as claimed in claim 22 in which the direct digital synthesis frequency signal generator comprises an adder for summing a phase offset digital word to each count value outputted by the phase accumulator for offsetting the phase of the stimulus signal by a predetermined offset.

28. A measuring circuit as claimed in claim 27 in which the phase offset digital word is selectable for selecting the phase offset of the stimulus signal.

29. A measuring circuit as claimed in claim 22 in which the frequency determining digital word is selectable for selecting the frequency of the stimulus signal.

30. A measuring circuit as claimed in claim 1 or claim 15 in which the measuring circuit is implemented as an integrated circuit.

31. A method for determining a characteristic of the impedance of a complex impedance element for facilitating characterization of the impedance thereof, the method comprising acts of:

providing a signal generating circuit on a single chip for generating an analog stimulus signal of selectable frequency for applying to the complex impedance element;

providing a first receiving circuit on the single chip for receiving an analog response signal from the complex impedance element in response to the stimulus signal and for outputting a first output signal indicative of the characteristic of the impedance of the complex impedance element for use in characterization of the impedance of the complex impedance element;

providing a signal processing circuit on the single chip for carrying out a Fast Fourier Transform on the first output signal to produce a third output signal for use in characterization of the impedance of the complex impedance element;

operating the signal generating circuit for applying the stimulus signal to the complex impedance element;

applying an analog response signal from the complex impedance element, responsive to the stimulus signal, to the first receiving circuit;

operating the first receiving circuit for producing the first output signal indicative of the characteristic of the impedance of the complex impedance element; and operating the signal processing circuit for carrying out a Fast Fourier Transform on the first output signal to produce the third output signal.

32. A method as claimed in claim 31 in which the first receiving circuit is operated for selectively and alternately outputting the first output signal to be indicative of one of a phase shift and an amplitude change of the stimulus signal caused by the complex impedance element.

33. A method as claimed in claim 31 in which the response signal from the complex impedance element is converted in the first receiving circuit to a voltage signal suitable for comparison with the stimulus signal.

34. A method as claimed in claim 33 in which the response signal from the complex impedance element is converted in the first receiving circuit to a DC signal of voltage level corresponding to the RIMS voltage value of the analog response signal.

35. A method as claimed in claim 31 in which the analog response signal from the complex impedance circuit is converted to a digital signal in the first receiving circuit for providing the first output signal as a digital signal.

36. A method as claimed in claim 31 in which the method comprises the further step of fabricating a second receiving circuit on the single chip for receiving the analog stimulus signal and for outputting a second output signal representative of the stimulus signal for comparison with the first output signal for facilitating a determination of the characteristic of the impedance of the complex impedance element.

37. A method as claimed in claim 36 in which the analog stimulus signal is converted to a digital signal in the second receiving circuit for providing the second output signal as a digital signal.

38. A method as claimed in claim 36 in which the analog stimulus signal is converted in the second receiving circuit to a DC signal of voltage level corresponding to the RMS value of the analog stimulus signal.

39. A method as claimed in claim 31 in which the signal generating circuit is provided as a direct digital synthesis frequency signal generator.

40. An integrated circuit for producing a signal indicative of a characteristic of the impedance of a complex impedance element for facilitating characterization of the impedance thereof, the integrated circuit being implemented on a single chip and comprising:

an output terminal through which an analog stimulus signal of selectable frequency is outputted for applying to the complex impedance element;

a signal generating circuit for generating the analog stimulus signal;

a signal conditioning circuit for conditioning the analog stimulus signal generated by the signal generating circuit and for applying the conditioned analog stimulus signal to the output terminal;

a receiving circuit for receiving an analog response signal from the complex impedance element in response to the stimulus signal, and for outputting an output signal indicative of the characteristic of the impedance of the complex impedance element; and a signal processing circuit for carrying out a Fast Fourier Transform on the output signal to produce a further output signal for use in characterization of the impedance of the complex impedance element.

41. An integrated circuit as claimed in claim 40 in which the signal conditioning circuit is adapted for setting one of the voltage level and the current level of the stimulus signal.

42. An integrated circuit as claimed in claim 40 in which the conditioning circuit is programmable.

43. An integrated circuit as claimed in claim 40 in which the signal conditioning circuit comprises a programmable gain element for selectively setting the maximum voltage amplitude of the analog stimulus signal.

44. An integrated circuit for producing a signal indicative of a characteristic of the impedance of a complex impedance element for facilitating characterization of the impedance thereof, the integrated circuit being implemented on a single chip and comprising:

an output terminal through which a stimulus signal in analog form of selectable frequency is outputted for applying to the complex impedance element, a direct digital synthesis frequency signal generator for generating the stimulus signal, the direct digital synthesis frequency signal generator comprising:

a phase accumulator comprising a counter for incrementing or decrementing its count by a frequency determining digital word to or from a predetermined maximum count value in response to each cycle of a clock signal, a phase-to-amplitude converter for converting count values from the phase accumulator to digital words representative of amplitude values of a sinusoidal waveform, a digital-to-analog converter for selectively converting the digital words produced by the phase accumulator and the phase-to-amplitude converter for selectively producing the stimulus signal in analog form as one of a triangular waveform and a sinusoidal waveform, and for applying the stimulus signal to the output terminal, and a first switch circuit for selectively coupling the phase accumulator and the phase-to-amplitude converter to the digital-to-analog converter to selectively produce the stimulus signal in analog form as the one of the triangular waveform and the sinusoidal waveform, and a receiving circuit for receiving a response signal in analog form from the complex impedance element in response to the stimulus signal, and for outputting an output signal indicative of the characteristic of the impedance of the complex impedance element for use in characterization of the impedance of the complex impedance element.

45. An integrated circuit as claimed in claim 44 in which a first bypass means is provided for applying the digital words produced by the phase accumulator to the digital-to-analog converter through the first switch circuit.

46. An integrated circuit as claimed in claim 44 in which a second switch circuit is provided for selectively applying one of the stimulus signals outputted by the digital-to-analog converter and values derived from the digital words produced by the phase accumulator indicative of the positive and negative states of the stimulus signal to the output terminal to selectively produce the stimulus signal in analog form as one of a square waveform, the triangular waveform and the sinusoidal waveform.

47. An integrated circuit as claimed in claim 46 in which a second bypass circuit is provided through which the values indicative of the positive and negative states of the stimulus signal derived from the digital words produced by the phase accumulator are applied to the output terminal through the second switch circuit.

48. An integrated circuit as claimed in claim 47 in which the second bypass circuit comprises a comparator for comparing the digital words produced by the phase accumulator with a reference value for producing the values indicative of the positive and negative states of the stimulus signal.

49. An integrated circuit as claimed in claim 44 in which an adder is provided for summing the respective count values produced by the phase accumulator with an offset determining digital word for generating the stimulus signal with a phase offset.

50. An integrated circuit as claimed in claim 49 in which the value of the offset determining digital word is selectable.

51. A measuring circuit as claimed in claim 1 in which the signal processing circuit is programmable.

52. A measuring circuit as claimed in claim 19 in which the signal processing circuit is adapted for carrying out a fast fourier transform on the second output signal.

53. An integrated circuit for producing a signal indicative of a characteristic of the impedance of a complex impedance element for facilitating characterization of the impedance thereof, the integrated circuit being implemented on a single chip and comprising:

a signal generating circuit for generating an analog stimulus signal of selectable frequency for applying to the complex impedance element;

a receiving circuit for receiving an analog response signal from the complex impedance element in response to the stimulus signal, and for producing an output signal indicative of the characteristic of the impedance of the complex impedance element; and a signal processing circuit for carrying out a Fast Fourier Transform on the output signal to produce a further output signal for use in characterization of the impedance of the complex impedance element.

54. An integrated circuit as claimed in claim 53 in which the signal processing circuit is programmable.

55. An integrated circuit as claimed in claim 53 in which the signal generating circuit comprises a signal conditioning circuit for setting one of the voltage level and the current level of the stimulus signal.

56. An integrated circuit as claimed in claim 55 in which the conditioning circuit is programmable.

57. An integrated circuit as claimed in claim 55 in which the signal conditioning circuit comprises a programmable gain element for selectively setting the maximum voltage amplitude of the analog stimulus signal.

58. An integrated circuit as claimed in claim 53 in which a temperature sensor is provided on the chip, and a switching circuit provided on the chip selectively switches the temperature sensor to the receiving circuit.

* * * * *